United States Patent
Patel et al.

(10) Patent No.: US 11,372,060 B2
(45) Date of Patent: Jun. 28, 2022

(54) BUSWAY JOINT CONNECTION MONITORING SYSTEM AND METHODS OF ASSEMBLING THE SAME

(71) Applicant: ABB Power Electronics Inc., Plano, TX (US)

(72) Inventors: Jayesh Ranchhodbhai Patel, Richardson, TX (US); Gary Dean Kirkpatrick, Garland, TX (US); Stanley Gene Kotwitz, Jr., Kaufman, TX (US); Roy Jaescentt Davis, Rowlett, TX (US)

(73) Assignee: ABB POWER ELECTRONICS INC., Plano, TX (US)

( * ) Notice: Subject to any disclaimer, the term of this patent is extended or adjusted under 35 U.S.C. 154(b) by 826 days.

(21) Appl. No.: 16/107,456

(22) Filed: Aug. 21, 2018

(65) Prior Publication Data

US 2019/0120890 A1    Apr. 25, 2019

Related U.S. Application Data

(60) Provisional application No. 62/575,008, filed on Oct. 20, 2017.

(51) Int. Cl.
*H02G 5/00* (2006.01)
*G01R 31/69* (2020.01)
(Continued)

(52) U.S. Cl.
CPC ............... *G01R 31/69* (2020.01); *G01K 1/14* (2013.01); *G01K 3/14* (2013.01); *H02G 5/007* (2013.01); *G01K 3/005* (2013.01)

(58) Field of Classification Search
None
See application file for complete search history.

(56) References Cited

U.S. PATENT DOCUMENTS

| 5,315,956 A | 5/1994 | Reno |
| 7,188,997 B2 | 3/2007 | Tillman et al. |

(Continued)

FOREIGN PATENT DOCUMENTS

| CN | 102931620 A | 2/2013 |
| CN | 203323879 U | 12/2013 |

(Continued)

OTHER PUBLICATIONS

Risdiyanto et al., "Study on Temperature Distribution at Busbar Connection Based on Contact Resistance of Different Plating Contact Surface", 2013 Joint International Conference on Rural Information & Communication Technology and Electric-Vehicle Technology (rICT & ICeV-T), Nov. 26-28, 2013, 6 Pages.

(Continued)

*Primary Examiner* — Hongmin Fan
(74) *Attorney, Agent, or Firm* — Armstrong Teasdale LLP (57) ABSTRACT

A power distribution busway joint monitoring sensor assembly is provided. A first sensor is configured to measure a first position temperature and generate a first signal indicative of the first position temperature, wherein the first position is proximate to a busway joint. A second sensor is configured to measure a second position temperature and generate a second signal indicative of the second position temperature. A sensor controller is configured to i) receive the first signal and the second signal, ii) process the first signal and the second signal, and iii) generate a processed first signal and a processed second signal. A system controller is configured to receive the processed first signal and the processed second signal and generate an alert when a temperature differential between the first position temperature and the second position temperature is greater than a predetermined threshold temperature.

20 Claims, 7 Drawing Sheets

(51) Int. Cl.
    *G01K 1/14*    (2021.01)
    *G01K 3/14*    (2006.01)
    *G01K 3/00*    (2006.01)

(56)         References Cited

U.S. PATENT DOCUMENTS

| | | | |
|---|---|---|---|
| 8,576,082 B2 | 11/2013 | Jones | |
| 9,638,733 B2* | 5/2017 | Dougherty | G01R 31/58 |
| 2002/0105436 A1* | 8/2002 | Bell | G01K 7/245 |
| | | | 340/870.17 |
| 2009/0035410 A1* | 2/2009 | Mizunuma | B29C 48/2556 |
| | | | 425/170 |
| 2012/0013471 A1* | 1/2012 | Jones | G01K 7/00 |
| | | | 340/584 |
| 2013/0273281 A1* | 10/2013 | Luo | C08L 81/02 |
| | | | 428/35.7 |
| 2014/0269829 A1* | 9/2014 | Bronczyk | G01K 1/08 |
| | | | 374/152 |
| 2016/0231286 A1* | 8/2016 | Liu | G01N 29/043 |
| 2019/0020159 A1* | 1/2019 | Wynnik | H02G 5/002 |

FOREIGN PATENT DOCUMENTS

| | | |
|---|---|---|
| CN | 203719782 U | 7/2014 |
| CN | 104362755 A | 2/2015 |
| CN | 204462910 U | 7/2015 |
| CN | 105466464 A | 4/2016 |

OTHER PUBLICATIONS

Zhou et al., "Characteristics of Overheated Electrical Joints Due to Loose Connection", 2011 IEEE 57th Holm Conference on Electrical Contacts (Holm), 2011, 7 Pages.

* cited by examiner

BUSWAY JOINT CONNECTION MONITORING SYSTEM AND METHODS OF ASSEMBLING THE SAME

CROSS REFERENCE TO RELATED APPLICATIONS

This application is a non-provisional application and claims priority to U.S. Provisional Patent Application Ser. No. 62/575,008 filed Oct. 20, 2017 for "BUSWAY JOINT CONNECTION MONITORING SYSTEM AND METHODS OF ASSEMBLING THE SAME", which is hereby incorporated by reference in its entirety.

BACKGROUND

The embodiments described herein relate generally to a busway joint connection monitoring system, and, more specifically, to a temperature measurement and fault detection sensor assembly for a power distribution busway joint and methods of assembly thereof.

Electrical power is transported using several methods in commercial and industrial systems. One of these methods includes using busbars to distribute electricity, which are generally easier to install and modify than cable and conduit assemblies. Busbars used in an enclosure are referred to as busways. Busways are modular conductors that serve as common connections for two or more circuits, and are typically constructed from aluminum or copper. Busways are easily connected together to rapidly supply power to a desired location and are often used to supply power in high-rise buildings, data centers, and industrial applications servicing heavy equipment and ventilation equipment. Busways are typically joined together using a bolted-type connection to form a busway joint. The busway joint must be properly connected to ensure electricity is efficiently transported through the joint and to prevent excessive heat buildup within the busway joint. However, a loose busway joint may be difficult to detect because the joint may still be capable of carrying current and may not fail during initial testing or within the startup phase of the system.

At least some known busway joint systems incorporate installation torque requirements for the assembly of busway joints. At least some other known busway joint systems utilize torque-to-yield bolts to facilitate subjecting the busway joint to the proper torque during assembly. However, such systems may not result in a properly assembled busway joint as a result of many factors such as improper lubrication or inadequate preventative maintenance of the busway joint components. Additionally, at least some known busway joint systems are monitored using infrared (IR) systems designed to detect loose and failing joints by identifying abnormal temperatures present in busway joints. Detecting an abnormal busway joint condition with IR analysis typically requires that the busway joint being examined be exposed and under high current load, and it may be difficult to identify failing joints in conditions where ambient temperatures are already relatively high. Accordingly, an efficient and effective method for detecting busway joint abnormalities is needed.

BRIEF DESCRIPTION

In one aspect, a power distribution busway joint monitoring sensor assembly is provided. The power distribution busway joint monitoring sensor assembly includes a busway joint cover, a first sensor, a second sensor, a sensor base, a sensor controller and a system controller. The first sensor is configured to measure a first position temperature at a first position and generate a first signal indicative of the first position temperature, wherein the first position is proximate to a busway joint. The sensor base is coupled to the first sensor and the busway joint cover and configured to retain the first sensor in the first position. The second sensor is configured to measure a second position temperature at a second position and generate a second signal indicative of the second position temperature, wherein the second position is different from the first position. The sensor controller is in communication with the first sensor and the second sensor and is configured to i) receive the first signal and the second signal, ii) process the first signal and the second signal, and iii) generate a processed first signal and a processed second signal. The system controller is in communication with the sensor controller and is configured to i) receive the processed first signal and the processed second signal, ii) determine a temperature differential between the first position temperature and the second position temperature based on a comparison between the processed first signal and the processed second signal, and iii) generate an alert when the temperature differential between the first position temperature and the second position temperature is greater than a predetermined threshold temperature.

In another aspect, a power distribution busway assembly is provided. The power distribution busway assembly includes a first busway including a first busbar and a second busway including a second busbar. The power distribution busway assembly also includes a busway joint including a joint stack coupled between the first busbar and the second busbar. The power distribution busway assembly includes a power distribution busway joint monitoring sensor assembly coupled to the busway joint proximate to the joint stack. The power distribution busway joint monitoring sensor assembly includes a busway joint cover, a first sensor, a second sensor, a sensor base, a sensor controller and a system controller. The first sensor is configured to measure a first position temperature at a first position and generate a first signal indicative of the first position temperature, wherein the first position is proximate to a busway joint. The sensor base is coupled to the first sensor and the busway joint cover and configured to retain the first sensor in the first position. The second sensor is configured to measure a second position temperature at a second position and generate a second signal indicative of the second position temperature, wherein the second position is different from the first position. The sensor controller is in communication with the first sensor and the second sensor and is configured to i) receive the first signal and the second signal, ii) process the first signal and the second signal, and iii) generate a processed first signal and a processed second signal. The system controller is in communication with the sensor controller and is configured to i) receive the processed first signal and the processed second signal, ii) determine a temperature differential between the first position temperature and the second position temperature based on a comparison between the processed first signal and the processed second signal, and iii) generate an alert when the temperature differential between the first position temperature and the second position temperature is greater than a predetermined threshold temperature.

In yet another aspect, a method of assembling a busway joint monitoring sensor assembly is provided. The method includes coupling a sensor base to a busway joint cover. The method also includes coupling a first sensor to the sensor base such that the first sensor is positioned at a first position, wherein the first sensor is configured to measure a temperature at the first position and generate a first signal indicative of the first position temperature. The method further includes positioning a second sensor at a second position different from the first position, wherein the second sensor is configured to measure a temperature at the second position and generate a second signal indicative of the second position temperature. The method includes coupling the first sensor and the second sensor to a sensor controller, wherein the sensor controller is configured to i) receive the first signal and the second signal, ii) process the first signal and the second signal, and iii) generate a processed first signal and a processed second signal. The method also includes coupling the sensor controller to a system controller, wherein the system controller is configured to i) receive the processed first signal and the processed second signal, ii) determine a temperature differential between the first position temperature and the second position temperature based on a comparison between the processed first signal and the processed second signal, and iii) generate an alert when the temperature differential between the first position temperature and the second position temperature is greater than a predetermined threshold temperature.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. A value modified by the term "substantially similar", as used herein throughout the specification and claims, may be applied to modify any quantitative representation within a range of five percent of the referenced quantitative representation, and more particularly, within a range of one percent of the referenced quantitative representation. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, a programmable logic controller (PLC), and application specific integrated circuit, and other programmable circuits, and these terms are used interchangeably herein. In the embodiments described herein, memory may include, but it not limited to, a computer-readable medium, such as a random access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program storage in memory for execution by personal computers, workstations, clients, and servers.

As used herein, the term "non-transitory computer-readable media" is intended to be representative of any tangible computer-based device implemented in any method of technology for short-term and long-term storage of information, such as, computer-readable instructions, data structures, program modules and sub-modules, or other data in any device. Therefore, the methods described herein may be encoded as executable instructions embodied in a tangible, non-transitory, computer-readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including without limitation, volatile and non-volatile media, and removable and non-removable media such as firmware, physical and virtual storage, CD-ROMS, DVDs, and any other digital source such as a network or the Internet, as well as yet to be developed digital means, with the sole exception being transitory, propagating signal.

Furthermore, as used herein, the term "real-time" refers to at least one of the time of occurrence of the associated events, the time of measurement and collection of predetermined data, the time to process the data, and the time of a system response to the events and the environment. In the embodiments described herein, these activities and events occur substantially instantaneously.

The embodiments described herein facilitate detecting a loose and/or faulty busway joint using a busway joint monitoring sensor assembly. Specifically, the busway joint monitoring sensor assembly includes a busway joint cover, a first sensor positioned in contact with and/or near a busway joint and within a sensor base that is coupled to the joint cover, a second sensor positioned at a different position than the first sensor, a sensor controller that is in communication with the first sensor and the second sensor, and a system controller that is in communication with the sensor controller. The system controller is configured to compare the signals received from the first sensor and the second sensor, determine a temperature differential between the temperatures present at the first sensor and the second sensor, and generate an alert or notification if the temperature differential exceeds a predetermined threshold based on test characterization data for the power distribution busway. Temperature profiles and trends can be analyzed using the data obtained from the first sensor and the second sensor. A temperature differential that exceeds the predetermined threshold is indicative of a loose and/or faulty connection within the busway joint. Such a configuration facilitates efficient and rapid detection of loose, highly resistive, and/or faulty connections within a busway assembly before significant energy is lost to heat generation or the joint fails entirely, promoting superior performance, reduced costs, and more efficient maintenance of the busway system. The remote monitoring and management capabilities of the busway joint monitoring sensor assembly facilitates reducing the need for personnel to physically inspect the busway joints with infrared scanners, for instance, and facilitates improving the safety of the overall power distribution system.

Figure 1:
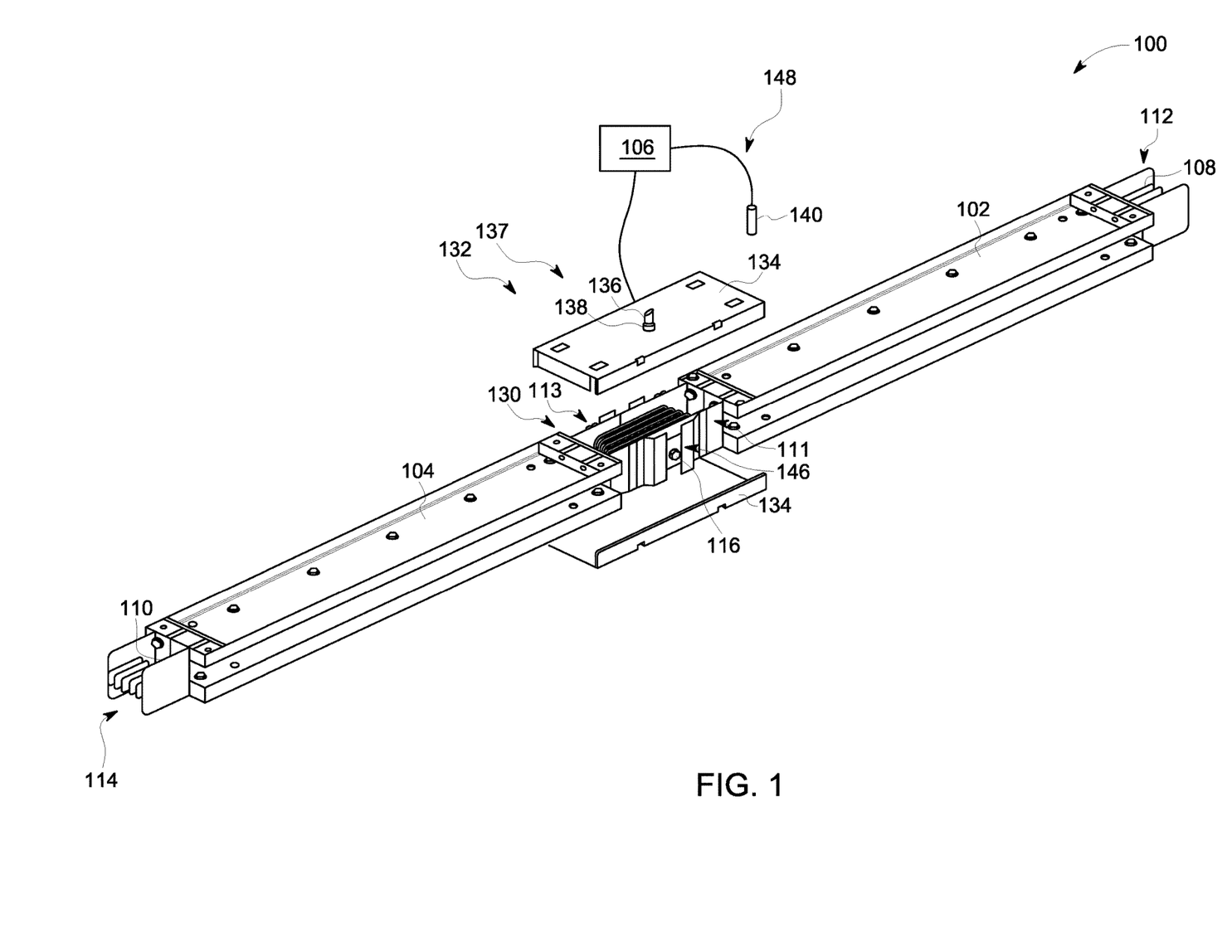
FIG. 1 is an exploded perspective view of an exemplary embodiment of a power distribution busway assembly illustrating an exemplary busway joint and an exemplary power distribution busway joint monitoring sensor assembly.

FIG. 1 is an exploded perspective view of an exemplary embodiment of a power distribution busway assembly 100 illustrating a busway joint 116 and a busway joint monitoring sensor assembly 132. In the exemplary embodiment, power distribution busway assembly 100 includes a first busway 102 including a first busbar 108 and a second busway 104 including a second busbar 110. First busbar 108 has a first end 111 and a second end 112. Second busbar 110 has a first end 114 and a second end 113. First busbar 108 and second busbar 110 are configured to carry electrical current through first busway 102 and second busway 104, respectively. In alternative embodiments, first busway 102 and second busway 104 may contain any type and number of busbars as enables power distribution busway assembly 100 to function as described herein.

In the exemplary embodiment, first end 111 of first busbar 108 is coupled to second end 113 of second busbar 110 using a joint stack 130 to form busway joint 116, enabling electrical current to be transferred from first busbar 108 to second busbar 110. A plurality of busway joint covers 134 substantially surround busway joint 116 to shield busway joint 116, first end 111 of first busbar 108, and second end 113 of second busbar 110 to prevent unintentional electrical transfer. Busway joint monitoring sensor assembly 132 includes one busway joint cover 134, a first sensor assembly 137 including a first sensor 136 and a sensor base 138 coupled to busway joint cover 134, a second sensor 140 located remotely from busway joint 116, a sensor controller 107 that is communicatively coupled to first sensor 136 and second sensor 140, and a system controller 106 that is communicatively coupled to sensor controller 107. Sensor controller 107 includes a memory coupled to a processor and is configured to monitor temperatures measured by first sensor 136 in a first position 146 and by second sensor 140 in a second position 148 for the purpose of sealing and processing information from first sensor 136 and second sensor 140. More specifically, in the exemplary embodiment, sensor controller 107 performs digital signal processing on the information received from first sensor 136 and second sensor 140 to standardize the levels and/or states of digital signals contained within the information. System controller 106 is configured to receive the sealed and processed information from sensor controller 107 for the purpose of detecting failing and/or improperly assembled busway joints and to alert a user to these conditions. In alternative embodiments, busway joint monitoring sensor assembly 132 may contain any type and number of components as enables busway joint monitoring sensor assembly 132 to function as described herein.

Figure 2:
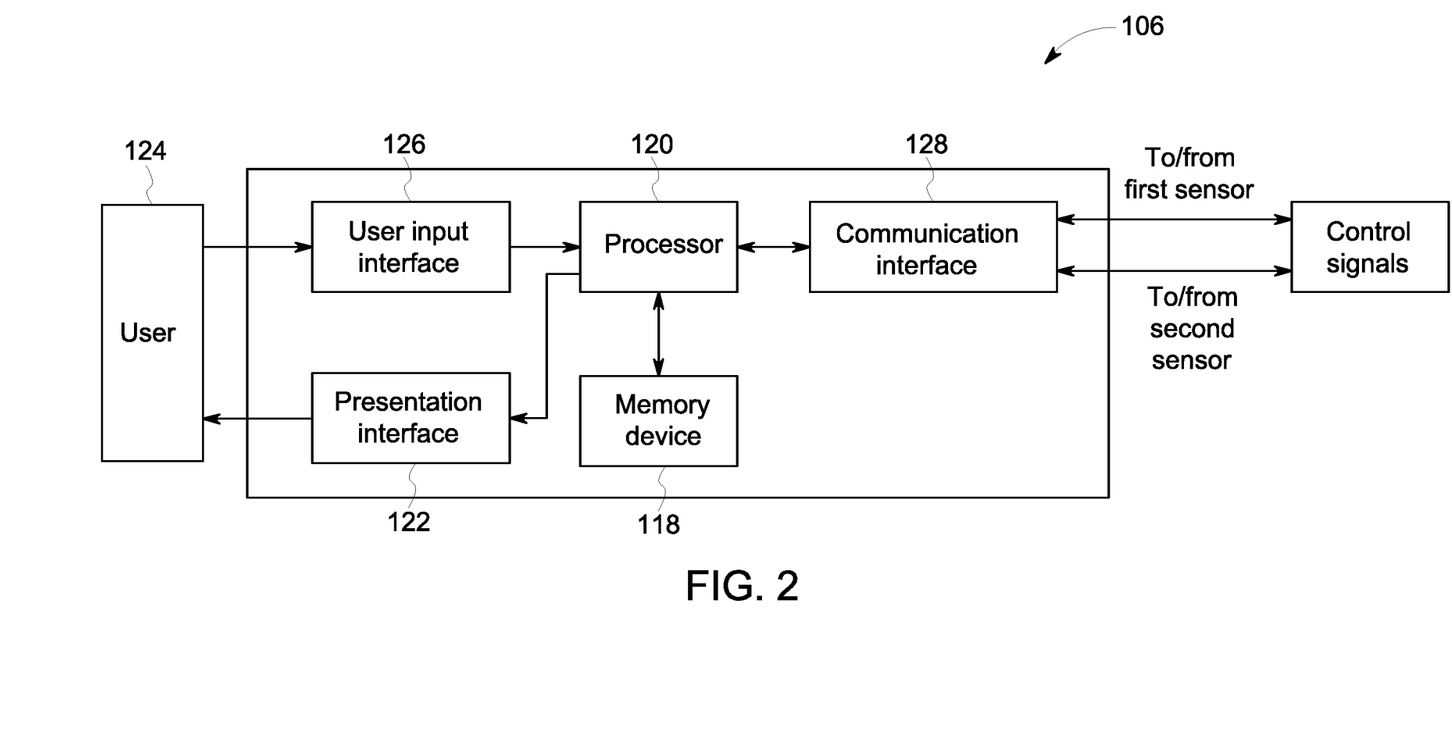
FIG. 2 is a block diagram of a controller that is used to operate the power distribution busway joint monitoring sensor assembly shown in FIG. 1.

FIG. 2 is a block diagram of a system controller 106 that is used to operate busway joint monitoring sensor assembly 132 (shown in FIG. 1). In the exemplary embodiment, system controller 106 is in communication with sensor controller 107, which is in communication with first sensor 136 and second sensor 140. System controller 106 executes operations to control the operation of busway joint monitoring sensor assembly 132 based at least partially on instructions from human operators. System controller 106 is programmed, for example, to generate an alert when a temperature differential between a temperature measured at first sensor 136 and a temperature measured at second sensor 140 exceeds a user-defined temperature differential stored in system controller 106. For example, in one embodiment, system controller 106 generates an audible alert. In another embodiment, system controller 106 vibrates. In yet another embodiment, system controller 106 transmits and alert signal. Alternatively, system controller 106 may generate any suitable alert. In the exemplary embodiment, the user-defined temperature differential is 50 degrees Celsius. In alternative embodiments, system controller 106 and sensor controller 107 may be any types of controllers that enable operation of busway joint monitoring sensor assembly 132 as described herein. In other alternative embodiments, system controller 106 may execute any operation and be set to generate an alert for any temperature differential that enables busway joint monitoring sensor assembly 132 to function as described herein.

In the exemplary embodiment, system controller 106 includes a memory device 118 and a processor 120 coupled to memory device 118. Processor 120 may include one or more processing units, such as, without limitation, a multi-core configuration. Processor 120 is any type of processor that permits system controller 106 to operate as described herein. In some embodiments, executable instructions are stored in memory device 118. System controller 106 is configurable to perform one or more operations described herein by programming processor 120. For example, processor 120 may be programmed by encoding an operation as one or more executable instructions and providing the executable instructions in memory device 118. In the exemplary embodiment, memory device 118 is one or more devices that enable storage and retrieval of information such as executable instructions or other data. Memory device 118 may include one or more computer readable media, such as, without limitation, random access memory (RAM), dynamic RAM, static RAM, a solid-state disk, a hard disk, read-only memory (ROM), erasable programmable ROM, electrically erasable programmable ROM, or non-volatile RAM memory. The above memory types are exemplary only, and are thus not limiting as to the types of memory usable for storage of a computer program.

Memory device 118 may be configured to store any type of data, including, without limitation, permissible temperature differentials for busway joint monitoring sensor assembly 132. In some embodiments, processor 120 removes or "purges" data from memory device 118 based on the age of the data. For example, processor 120 may overwrite previously recorded and stored data associated with a subsequent time or event. In addition, or alternatively, processor 120 may remove data that exceeds a predetermined time interval. In addition, memory device 118 includes, without limitation, sufficient data, algorithms, and commands to facilitate monitoring of temperatures at first sensor 136 and second sensor 140 and to generate alerts with system controller 106.

In some embodiments, system controller 106 includes a presentation interface 122 coupled to processor 120. Presentation interface 122 presents information, such as the current measured temperatures at first sensor 136 and second sensor 140, to a user 124. In one embodiment, presentation interface 122 includes a display adapter (not shown) coupled to a display device (not shown), such as a cathode ray tube (CRT), a liquid crystal display (LCD), an organic LED (OLED) display, or an "electronic ink" display. In some embodiments, presentation interface 122 includes one or more display devices. In addition, or alternatively, presentation interface 122 includes an audio output device (not shown), for example, without limitation, an audio adapter or a speaker (not shown).

In some embodiments, system controller 106 includes a user input interface 126. In the exemplary embodiment, user input interface 126 is coupled to processor 120 and receives input from user 124. User input interface 126 may include, for example, without limitation, a keyboard, a pointing device, a mouse, a stylus, a touch sensitive panel, such as, without limitation, a touch pad or a touch screen, and/or an audio input interface, such as, without limitation, a microphone. A single component, such as a touch screen, may function as both a display device of presentation interface 122 and user input interface 126.

In the exemplary embodiment, a communication interface 128 is coupled to processor 120 and is configured to be coupled in communication with one or more other devices, such as first sensor 136 and second sensor 140, and to perform input and output operations with respect to such devices while performing as an input channel. For example, communication interface 128 may include, without limitation, a wired network adapter, a wireless network adapter, a mobile telecommunications adapter, a serial communication adapter, or a parallel communication adapter. Communication interface 128 may receive a data signal from or transmit a data signal to one or more remote devices.

Presentation interface 122 and communication interface 128 are both capable of providing information suitable for use with the methods described herein, such as, providing information to user 124 or processor 120. Accordingly, presentation interface 122 and communication interface 128 may be referred to as output devices. Similarly, user input interface 126 and communication interface 128 are capable of receiving information suitable for use with the methods described herein and may be referred to as input devices. Information relating to operation of power distribution busway assembly 100 may be available over standard network managers using TCP/IP protocols such as SNMPV2C, SNMPV3, Modbus TCP, and TL1. Additionally, Sensor controller 107 and System controller 106 may have their own built-in internet-capable servers which facilitate allowing a user to utilize an internet browser to retrieve information over a network connection.

Figure 3:
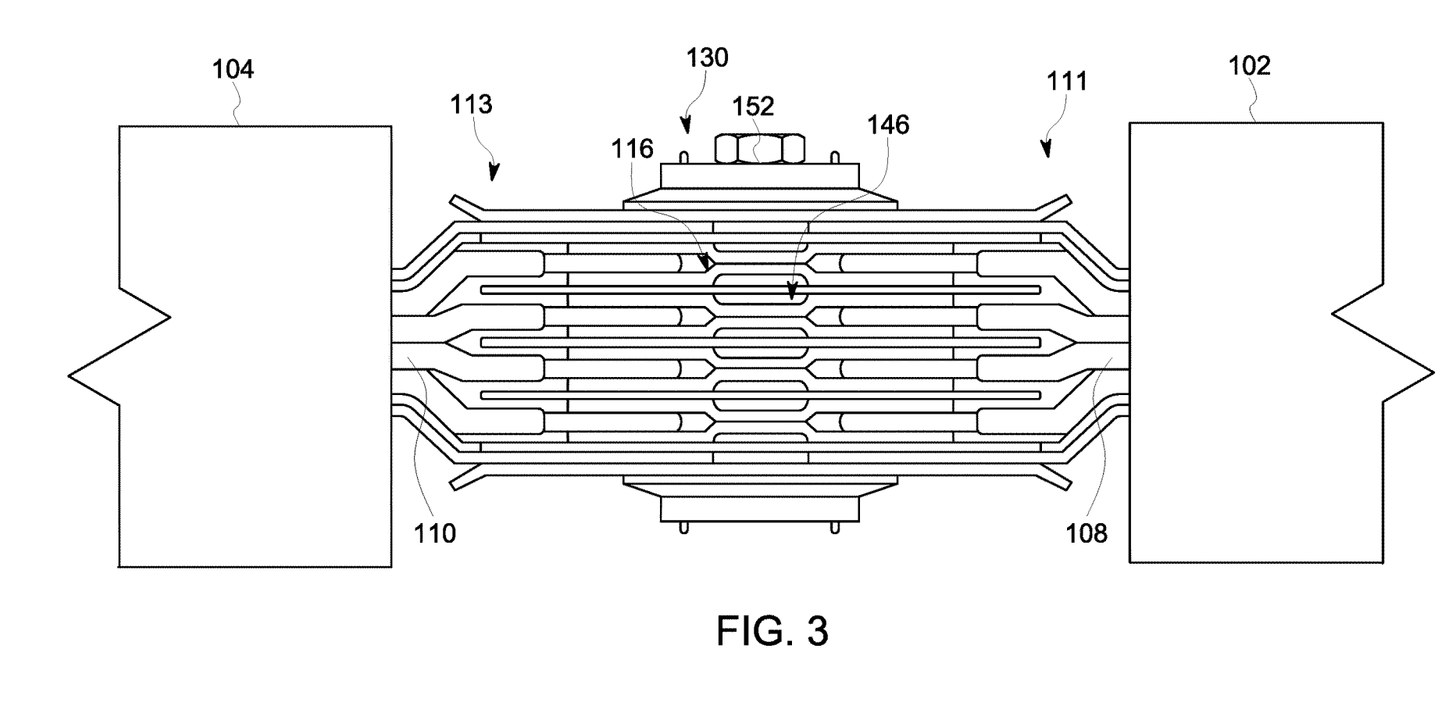
FIG. 3 is a top view of the busway joint shown in FIG. 1 illustrating an exemplary joint stack.
Figure 4:
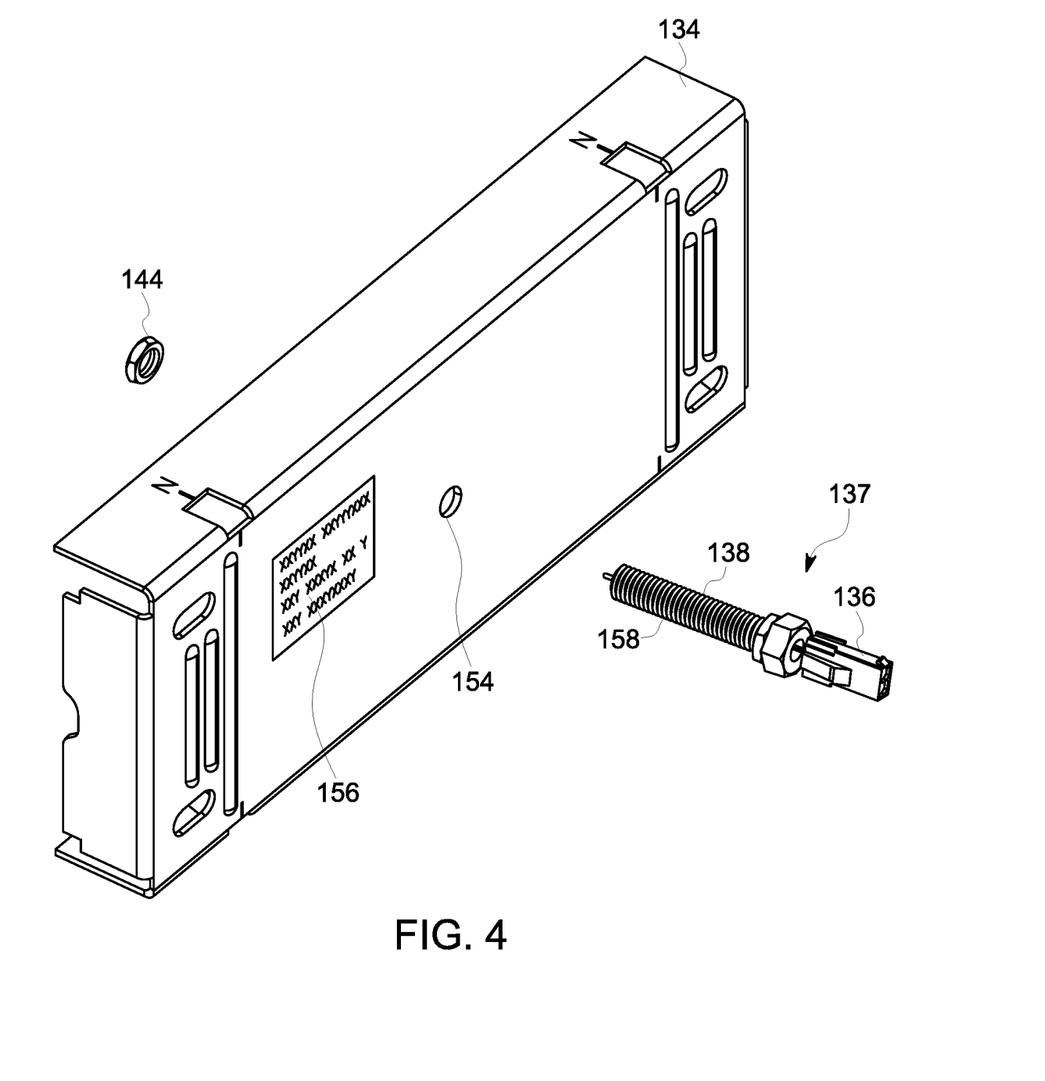
FIG. 4 is an exploded perspective of the power distribution busway joint monitoring sensor assembly shown in FIG. 1 illustrating an exemplary first sensor assembly.
Figure 5:
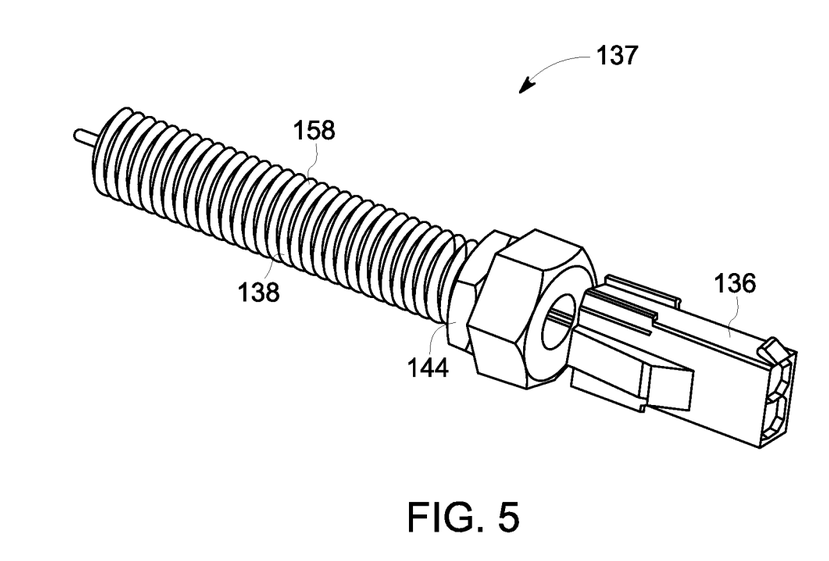
FIG. 5 is a perspective view of the first sensor assembly shown in FIG. 4.

FIG. 3 is a top view of busway joint 116 (shown in FIG. 1) illustrating an exemplary joint stack 130. FIG. 4 is an exploded perspective of exemplary busway joint monitoring sensor assembly 132 (shown in FIG. 1) illustrating an exemplary first sensor assembly 137. FIG. 5 is a perspective view of first sensor assembly 137 (shown in FIG. 4). In the exemplary embodiment, joint stack 130 is a connector configured to receive first busbar first end 111 and second busbar second end 113. A joint stack fastener 152 is threaded into and through a threaded portion of joint stack 130 until a certain amount of torque is reached by fastener 152, compressing portions of joint stack 130 and securing first busbar 108 to second busbar 110. In alternative embodiments, fastener 152 is a torque-to-yield fastener. In other alternative embodiments joint stack 130 may secure first busbar 108 to second busbar 110 in any manner that enables operation of power distribution busway assembly 100 as described herein.

In the exemplary embodiment, busway joint monitoring sensor assembly 132 is coupled to first busway 102 and second busway 104 proximate to joint stack 130. Sensor base 138 includes a threaded portion 158 of length 160 extending through a busway joint cover opening 154 of busway joint cover 134. Threaded portion 158 is threaded to receive a first nut 139 and a second nut 141. To secure sensor base 138 to busway joint cover 134, first nut 139 is threaded onto threaded portion 158 and positioned against an outer face 135 of busway joint cover 134 and second nut 141 is threaded onto threaded portion 158 and positioned against an inner face 133 of busway joint cover 134. A label 156 is affixed to a surface of busway joint cover 134 and includes information relating to the type of cover and sensor that are being used as part of busway joint monitoring sensor assembly 132. In an alternative embodiment, busway joint cover 134 may include any number and type of openings and identifying markings as enable operation of busway joint monitoring sensor assembly 132 as described herein.

In the exemplary embodiment, sensor base 138 is configured to retain first sensor 136 in a first position 146, wherein first position 146 is proximate to busway joint 116. First position 146 may be altered by modifying the position of first nut 139 and/or second nut 141 on threaded portion 158 relative to busway joint cover 134, and/or by an alternate sensor base 138 having a differing length 160. In alternative embodiments, when in first position 146, first sensor 136 may be any distance from busway joint 116, including touching at least a portion of busway joint 116, that enables operation of busway joint monitoring sensor assembly 132 as described herein. First sensor 136 includes a probe 162 and is configured to measure a first position temperature at first position 146 and to generate a first signal. In the exemplary embodiment, first sensor 136 is a 100 kohm thermistor configured to generate a signal correlating to a temperature at first position 146. In the exemplary embodiment, sensor base 138 includes a non-conductive plastic material having an Underwriters Laboratories (UL) vertical burn test (V) rating of 94. In alternative embodiments, first sensor 136 may be retained in first position 146 in any manner that enables operation of busway joint monitoring sensor assembly 132 as described herein. In further alternative embodiments, probe 162 may be of any type of sensor probe and may include any material that facilitates operation of first sensor 136 as described herein.

Second sensor 140 includes a probe 162 and is located remotely at second position 148 (both shown in FIG. 1). That is, second position 148 is located at a position away from busway joint 116 such that second sensor 140 is able to measure an ambient air temperature that is not influenced by heat generated by electric current being carried through busway joint 116. In the exemplary embodiment, second sensor 140 is a 100 kohm thermistor and is configured to generate a second signal correlating to a temperature at second position 148. In alternative embodiments, probe 162 may be of any type of sensor probe and may include any material that facilitates operation of second sensor 140 as described herein. In further alternative embodiments, first sensor 136 and second sensor 140 are any type of sensors that enable busway joint monitoring sensor assembly 132 to function as described herein.

In the exemplary embodiment, first sensor 136 and second sensor 140 are in communication directly with system controller 106. In an alternative embodiment, first sensor 136 is coupled to a remote peripheral measurement (RPM) device that is positioned proximate to busway joint cover 134. In the alternative embodiment, the RPM device includes second sensor 140 and is in communication with system controller 106 to facilitate a modular implementation of busway joint monitoring sensor assembly 132 as part of power distribution busway assembly 100. In other alternative embodiments, first sensor 136 and second sensor 140 may be coupled to system controller 106 in any manner that facilitates operation of busway joint monitoring sensor assembly 132 as described herein.

Figure 6:
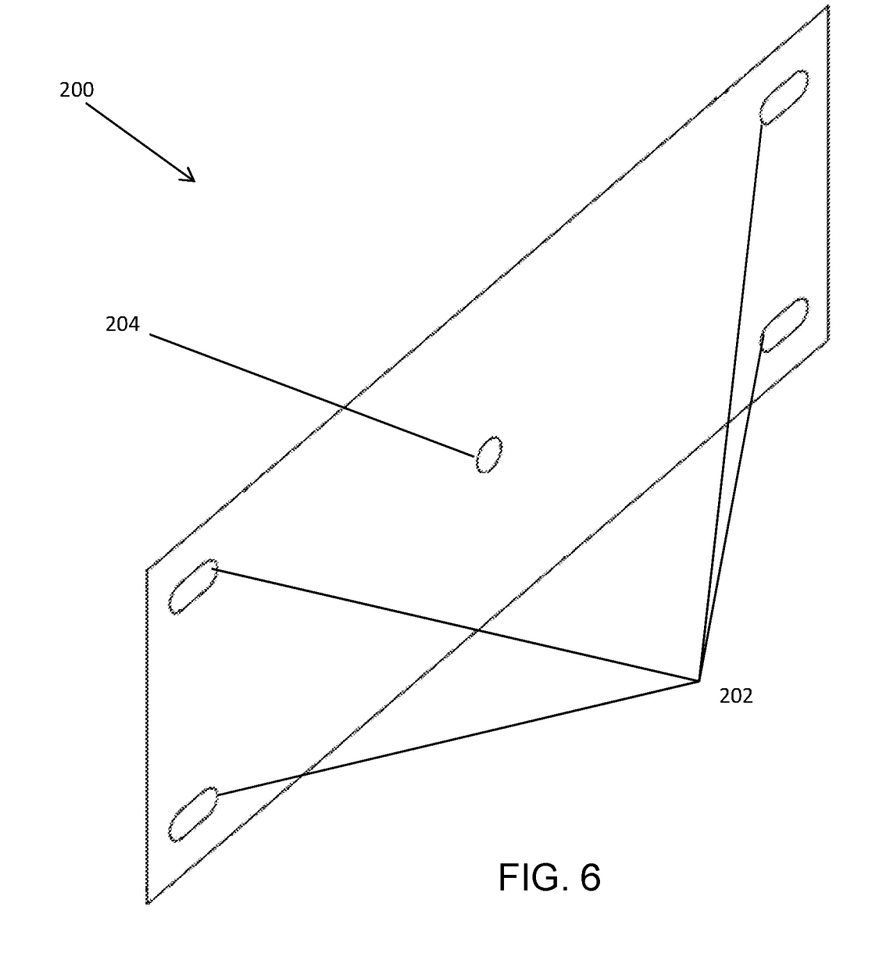
FIG. 6 is a perspective view of an exemplary busway joint cover sensor mounting template.

FIG. 6 is a perspective view of an exemplary busway joint cover sensor mounting template 200. In the exemplary embodiment, busway joint covers 134 that do not include busway joint cover opening 154 may be modified to include at least one busway joint cover opening 154 by using busway joint cover sensor mounting template 200. Busway joint cover sensor mounting template 200 includes a plurality of template locating openings 202 and at least one probe base locating opening 204. To modify a busway joint cover 134 that does not include busway joint cover opening 154, busway joint cover sensor mounting template 200 is positioned against busway joint cover outer face 135. Template locating openings 202 are aligned with corresponding busway joint cover mounting openings 150, and busway joint cover sensor mounting template 200 is secured to busway joint cover 134. Using probe base locating opening 204 as a guide, material is removed from busway joint cover 134 to form busway joint cover opening 154. In the exemplary embodiment, material is removed from busway joint cover 134 to form busway joint cover opening 154 using a drill bit while busway joint cover 134 is decoupled from busway joint assembly 100. In an alternative embodiment, busway joint cover opening 154 may be formed in any manner that facilitates operation of busway joint monitoring sensor assembly 132 as described herein.

Figure 7:
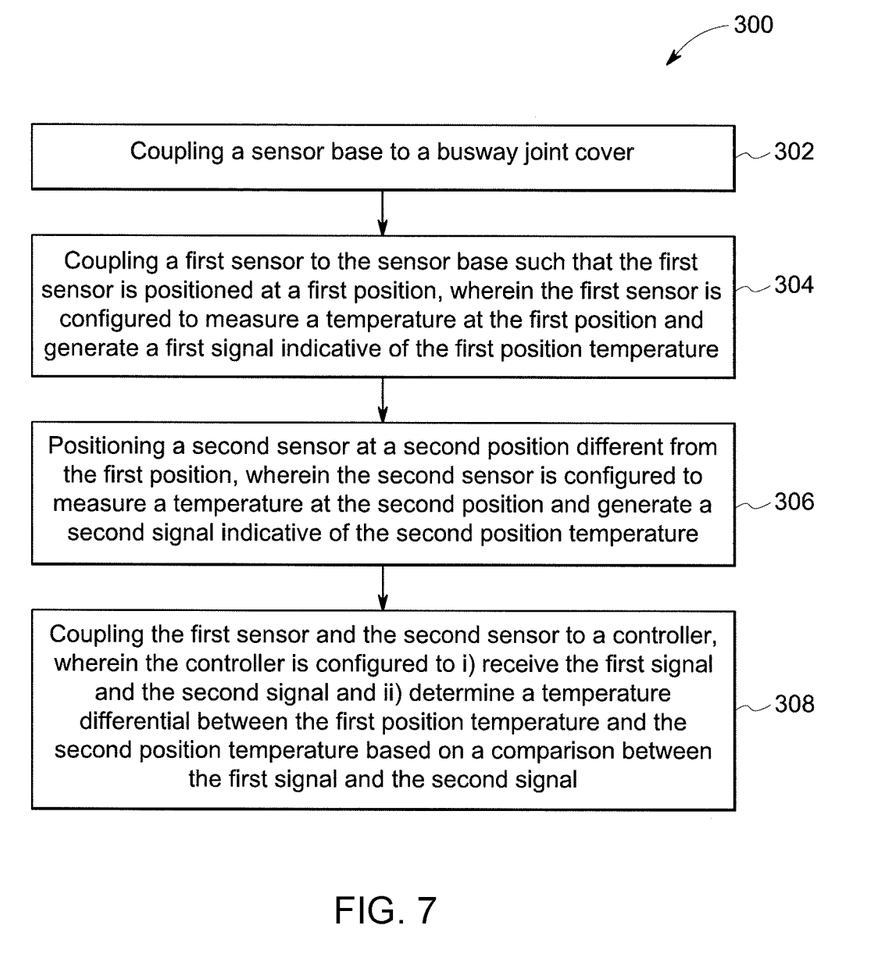
FIG. 7 is a flow chart illustrating a method for assembling a power distribution busway joint monitoring sensor.

FIG. 7 is a flow chart illustrating a method 300 for assembling a busway joint monitoring sensor assembly 132. Referring to FIGS. 1-5, method 300 includes coupling 302 a sensor base 138 to a busway joint cover 134. Method 300 also includes coupling 304 a first sensor 136 to sensor base 138 such that first sensor 136 is positioned at a first position 146, wherein first sensor 136 is configured to measure a temperature at first position 146 and generate a first signal indicative of the first position temperature. Method 300 further includes positioning 306 a second sensor 140 at a second position 148 different from first position 146, wherein second sensor 140 is configured to measure a temperature at second position 148 and generate a second signal indicative of the second position temperature. Method 300 includes coupling 308 first sensor 136 and second sensor 140 to a sensor controller 107, wherein sensor controller 107 is configured to i) receive the first signal and the second signal, ii) process the first signal and the second signal, and iii) generate a processed first signal and a processed second signal. Method 300 also includes coupling 310 sensor controller 107 to a system controller 106, wherein system controller 106 is configured to i) receive the processed first signal and the processed second signal, ii) determine a temperature differential between the first position temperature and the second position temperature based on a comparison between the processed first signal and the processed second signal, and iii) generate an alert when the temperature differential between the first position temperature and the second position temperature is greater than a predetermined threshold temperature.

The above-described sensor assemblies herein facilitate detecting a loose and/or faulty busway joint using a busway joint monitoring sensor assembly. Specifically, the busway joint monitoring sensor assembly includes a busway joint cover, a first sensor positioned near a busway joint and within a sensor base that is coupled to the joint cover, a second sensor positioned at a different position than the first sensor, and a controller that is in communication with the first sensor and the second sensor. The controller is configured to compare the signals received from the first sensor and the second sensor and determine a temperature differential between the temperatures present at the first sensor and the second sensor and to generate an alert, or notification, if the temperature differential exceeds a predetermined threshold. The presence of a temperature differential that exceeds the predetermined threshold is indicative of a loose and/or faulty connection within the busway joint. Such a configuration facilitates efficient and rapid detection of loose and/or faulty connections within a busway assembly before significant energy is lost to heat or the joint fails entirely, promoting superior performance, reduced costs, and more efficient maintenance of the busway system.

An exemplary technical effect of the methods, systems, and apparatus described herein includes at least one of: (a) facilitating detection of loose and/or faulty busway joints in a busway system; (b) reducing the cost of operating a busway system; (c) reducing energy loss through loose and/or faulty busway joints; and (d) reducing unplanned service outages due to busway joint failures.

Exemplary embodiments of a busway joint monitoring sensor assembly are described above in detail. The busway joint monitoring sensor assemblies, and methods of assembling the same are not limited to the specific embodiments described herein, but rather, components of systems and/or steps of the methods may be utilized independently and separately from other components and/or steps described herein. For example, the methods may also be used in combination with other components of a busway or busbar system, and are not limited to practice with only the systems and methods as described herein. Rather, the exemplary embodiment may be implemented and utilized in connection with many other electrical transmission applications that require a connection monitoring sensor assembly.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A power distribution busway joint monitoring sensor assembly comprising:
a busway joint cover configured to surround a busway joint;
a first sensor configured to measure a first position temperature at a first position and generate a first signal indicative of the first position temperature, wherein the first position is proximate to a busway joint;
a sensor base coupled to said first sensor and said busway joint cover and configured to retain said first sensor in the first position, the sensor base extending through the busway joint cover;
a second sensor configured to measure a second position temperature at a second position and generate a second signal indicative of the second position temperature, wherein the second position is different from the first position;
a sensor controller in communication with said first sensor and said second sensor, said sensor controller configured to i) receive the first signal and the second signal, ii) process the first signal and the second signal, and iii) generate a processed first signal and a processed second signal; and
a system controller in communication with said sensor controller, said system controller configured to i) receive the processed first signal and the processed second signal, ii) determine a temperature differential between the first position temperature and the second position temperature based on a comparison between the processed first signal and the processed second signal, and iii) generate an alert when the temperature differential between the first position temperature and the second position temperature is greater than a predetermined threshold temperature.

2. The power distribution busway joint monitoring sensor assembly in accordance with claim 1, wherein said first sensor in the first position is configured to measure a temperature of the busway joint, and a portion of the first sensor is positioned outside the busway joint cover.

3. The power distribution busway joint monitoring sensor assembly in accordance with claim 1, wherein said first sensor and said second sensor are each 100 kohm thermistors.

4. The power distribution busway joint monitoring sensor assembly in accordance with claim 1, wherein said second sensor is located remotely from the busway joint.

5. The power distribution busway joint monitoring sensor assembly in accordance with claim 1, wherein said sensor base comprises a non-conductive plastic material having an Underwriters Laboratories (UL) burn test (V) rating of 94.

6. The power distribution busway joint monitoring sensor assembly in accordance with claim 1, wherein said sensor base is threaded to receive a first nut and a second nut, and wherein said first nut is positioned against an outer face of said busway joint cover and said second nut is positioned against an inner face of said busway joint cover.

7. The power distribution busway joint monitoring sensor assembly in accordance with claim 6, wherein the predetermined threshold temperature is approximately 50 degrees Celsius.

8. A power distribution busway assembly comprising:
a first busway comprising a first busbar;
a second busway comprising a second busbar;
a busway joint comprising a joint stack coupled between said first busbar and said second busbar; and
a power distribution busway joint monitoring sensor assembly comprising:
a busway joint cover surrounding the busway joint;
a first sensor configured to measure a first position temperature at a first position and generate a first signal indicative of the first position temperature, wherein the first position is proximate to a busway joint;
a sensor base coupled to said first sensor and said busway joint cover and configured to retain said first sensor in the first position, the sensor base extending through the busway joint cover;
a second sensor configured to measure a second position temperature at a second position and generate a second signal indicative of the second position temperature, wherein the second position is different from the first position; and
a sensor controller in communication with said first sensor and said second sensor, said sensor controller configured to i) receive the first signal and the second signal, ii) process the first signal and the second signal, and iii) generate a processed first signal and a processed second signal; and
a system controller in communication with said sensor controller, said system controller configured to i) receive the processed first signal and the processed second signal, ii) determine a temperature differential between the first position temperature and the second position temperature based on a comparison between the processed first signal and the processed second signal, and iii) generate an alert when the temperature differential between the first position temperature and the second position temperature is greater than a predetermined threshold temperature.

9. The power distribution busway assembly in accordance with claim 8, wherein said first sensor in the first position is configured to measure a temperature of the busway joint, and a portion of the first sensor is positioned outside the busway joint cover.

10. The power distribution busway assembly in accordance with claim 8, wherein said first sensor and said second sensor are each 100 kohm thermistors.

11. The power distribution busway assembly in accordance with claim 8, wherein said second sensor is located remotely from said busway joint.

12. The power distribution busway assembly in accordance with claim 8, wherein said sensor base comprises a non-conductive plastic material having an Underwriters Laboratories (UL) burn test (V) rating of 94.

13. The power distribution busway assembly in accordance with claim 8, wherein said sensor base is threaded to receive a first nut and a second nut, and wherein said first nut is positioned against an outer face of said busway joint cover and said second nut is positioned against an inner face of said busway joint cover.

14. The power distribution busway assembly in accordance with claim 13, wherein the predetermined threshold temperature is approximately 50 degrees Celsius.

15. A method of assembling a power distribution busway joint monitoring sensor assembly, said method comprising:

coupling a sensor base to a busway joint cover by extending the sensor base through the busway joint cover, wherein the busway joint cover is configured to surround a busway joint;

coupling a first sensor to the sensor base such that the first sensor is positioned at a first position, wherein the first sensor is configured to measure a temperature at the first position and generate a first signal indicative of the first position temperature;

positioning a second sensor at a second position different from the first position, wherein the second sensor is configured to measure a temperature at the second position and generate a second signal indicative of the second position temperature;

coupling the first sensor and the second sensor to a sensor controller, wherein the sensor controller is configured to i) receive the first signal and the second signal, ii) process the first signal and the second signal, and iii) generate a processed first signal and a processed second signal; and coupling the sensor controller to a system controller, wherein the system controller is configured to i) receive the processed first signal and the processed second signal, ii) determine a temperature differential between the first position temperature and the second position temperature based on a comparison between the processed first signal and the processed second signal, and iii) generate an alert when the temperature differential between the first position temperature and the second position temperature is greater than a predetermined threshold temperature.

16. The method in accordance with claim 15, wherein coupling a sensor base to a busway joint cover further comprises:

aligning a template with the busway joint cover such that a plurality of template locating openings align with a corresponding plurality of busway joint cover mounting openings; and forming a busway joint cover opening using a busway joint cover opening guide hole located in the template.

17. The method in accordance with claim 15, wherein coupling a first sensor to the sensor base comprises coupling a 100 kohm thermistor to the sensor base.

18. The method in accordance with claim 15, wherein coupling a first sensor to the sensor base further comprises positioning a portion of the first sensor outside the busway joint cover.

19. The method in accordance with claim 15, wherein positioning a second sensor at a second position comprises positioning a 100 kohm thermistor at the second position.

20. The method in accordance with claim 15, wherein coupling a sensor base to a busway joint cover comprises coupling the sensor base to the busway joint cover using a first nut positioned against an outer face of the busway joint cover and a second nut positioned against an inner face of the busway joint cover.

* * * * *